United States Patent [19]

Sano et al.

[11] 4,079,159
[45] Mar. 14, 1978

[54] ORIGINAL PLATE FOR PRODUCING MATRIX

[75] Inventors: Takezo Sano; Tadanori Inoue, both of Ibaragi, Japan

[73] Assignee: Sumitomo Chemical Company, Limited, Osaka, Japan

[21] Appl. No.: 603,607

[22] Filed: Aug. 11, 1975

Related U.S. Application Data

[63] Continuation-in-part of Ser. No. 423,877, Dec. 12, 1973, abandoned.

[30] Foreign Application Priority Data

Dec. 18, 1972 Japan .............................. 47-127451

[51] Int. Cl.$^2$ .............................................. B32B 7/02
[52] U.S. Cl. ...................................... 428/172; 96/35.1;
96/115 P; 428/213; 428/337; 428/339;
428/458; 428/461; 428/462; 428/463; 428/908;
428/215
[58] Field of Search ............... 428/156, 172, 908, 909,
428/458, 461, 462, 463, 337, 213, 215; 96/35.1,
36.3, 115 P, 115 R; 249/157 R; 264/219

[56] References Cited

U.S. PATENT DOCUMENTS

| | | | |
|---|---|---|---|
| 2,791,504 | 5/1967 | Plambeck, Jr. | 96/35.1 |
| 2,964,401 | 12/1960 | Plambeck, Jr. | 96/35.1 |
| 3,062,674 | 11/1962 | Houck et al. | 96/114 |
| 3,186,844 | 6/1965 | Alles et al. | 96/35.1 |
| 3,259,499 | 7/1966 | Thommes | 96/35.1 |
| 3,380,825 | 4/1968 | Webers | 96/35.1 |
| 3,535,193 | 10/1970 | Prince | 260/79.5 |

FOREIGN PATENT DOCUMENTS 864,041 3/1961 United Kingdom.

Primary Examiner—George F. Lesmes
Assistant Examiner—Stanley S. Silverman
Attorney, Agent, or Firm—Stevens, Davis, Miller & Mosher

[57] ABSTRACT

A novel original plate for producing matrix which has improved strength, mold releasability and dimensional stability during production of matrices consists of a laminated structure of a metal base, a bonding layer, a relief supporting layer and a relief of a photo-polymerized resin, said relief supporting layer comprising a resin similar to that of the relief or having a high affinity with that of the relief.

6 Claims, 1 Drawing Figure

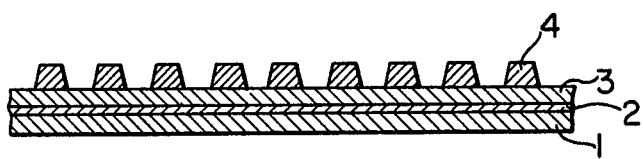

ORIGINAL PLATE FOR PRODUCING MATRIX

CROSS REFERENCE

The present application is a continuation-in-part application of U.S. Ser. No. 423,877 filed on Dec. 12, 1973 now abandoned.

The present invention relates to an original plate for production of a matrix, which has a laminated structure consisting of a metal base, a bonding layer, a relief supporting layer (resin) and a relief (resin).

Conventionally, in relief printing, a matrix is produced from an original plate and a printing plate is produced from the matrix to obtain many printing plates. As the original plate, an engraved plate, hand set type matter, and metal etched plate have been used. Use of thermosetting resin plate and thermoplastic resin plate as well as paper matrix for lead plate have been developed for production of a female mold, namely, a matrix. Moreover, as the printing plate produced from thus obtained matrix, various plates such as lead plate, rubber plate, and resin plate have been used. Recently, with increased demand for prevention of environmental pollution and labor-saving, pollution due to waste effluent from production of metal etched plates, lead poisoning in hand setting type matter, etc. have become problems. For overcoming these problems, the cold type system, for instance, edition by computor → a negative film → photoimaging resin original plate or printing plate will be developed in the future. Such a system as producing printing plate from matrix produced from original plate made of photopolymerized resin is offered. But there are many difficulties in this system for practice. The main difficulties are low strength, poor dimensional stability, difficult releasability, etc. in production of matrix. The matrix is generally produced by pressing a material for matrix to original plate by press or roll. Temperature and pressure for production of matrix vary depending upon the kind of materials of original plate and matrix. For example, a paper matrix may be produced at room temperature and under a pressure of 150 kg/cm$^2$ by roll. When a thermoplastic resin is used as material for matrix, the pressing must be carried out at a softening point thereof or higher temperature and under a pressure of at least 1 kg/cm$^2$. Generally, the pressing is carried out at 100°–300° C and under 1–50 kg/cm$^2$. Therefore, the original plate to be used is required to have a mechanical strength high enough to suffer no deformation and no damages such as cracks and removal of relief under the above conditions. More specifically, thermal resistance and strength of material of the original plate, adhesion between relief and base, dimensional stability of relief, etc. are important. Furthermore, from the point of processability, good mold releasability is required. When releasing is difficult, anomalous force is applied at releasing and the original plate or matrix is apt to be broken.

Most of the commercially available photopolymerized resin plates were developed for printing plate and these do not meet the above requirements to be used as original plate.

The object of the present invention is to provide a novel original plate having a structure of improved strength, releasability and stability in production of matrix.

The inventors have made an attempt to obtain an original plate which satisfies said requirements. On the assumption that thermal resistance and strength of the original plate depend greatly upon properties of the material of the plate, but practically important properties such as fracture resistance and dimensional stability of the original plate, peel resistance and mold releasability of the relief in the production of matrix are rather attributable to structure of the plate itself, they have made researches on improvement of structure of photopolymerized resin plate. As the result, it has been found that the dimensional stability can be maintained by using a metal base and fracture resistance, peel resistance of relief and mold releasability of the matrix can be improved by providing a relief supporting layer of a resin which is similar to that of the relief or has a high affinity with that of the relief.

That is, the original plate of the present invention, as shown in the accompanying FIGURE, is an original plate for producing a matrix having a laminated structure consisting of a metal base 1, a bonding layer 2, a relief supporting layer 3 which is composed of a resin similar to or highly affinitive with the resin of relief and relief 4 which is formed from a photo-polymerized resin.

As literature disclosing a resin plate having such a multi-layer structure, for example, U.S. Pat. No. 3,259,499 has been known. In this U.S. patent, as mentioned in Example 4 and FIG. 4 thereof, an element comprising six layers is formed and then a printing relief is obtained therefrom in order to use for dry-offset printing on a rotary press. That is, the printing relief of this patent is used as a "printing plate", and in this case it is required that the thickness of integral polymerized layer is not more than one-fifth the total thickness of the element. In order to use such resin plate as original plate for production of matrix, the resin plate and materials constituting it are required to have properties satisfying the severe requirements for production of matrix.

Bases of soft materials such as resins and the like deform at production of matrix by pressing and sufficient dimensional stability cannot be maintained. Change in dimension of plate can be prevented by using a metal base which has much smaller thermal expansion coefficient than resins and a high modulus of elasticity. In production of matrix by pressing a thermoplastic resin with heat to an original plate, change in dimension of the original plate is about 1% in case of resin base and merely 0.1% in case of metal base. Furthermore, relief can be strongly held by providing a relief supporting layer. Without this layer, the relief is bonded to the metal base only by a bonding layer. Therefore, in production of matrix by pressing, partial removal of relief tends to occur due to fracture of the bonding layer and a part of the relief often sticks to matrix. When a relief supporting layer which is similar to the relief or is highly affinitive with the relief is provided, the bonding between the relief and the supporting layer becomes complete and the relief supporting layer and the base are strongly bonded and are not easily separated owing to the wide contact area thereof. Thus, partial removal of the relief can be completely prevented.

The second advantage brought about by the presence of the relief supporting layer is improvement in mold releasability. When relief is merely put on a metal base, material of matrix directly contacts with metal at the portions where no relief is present on the surface of the original plate. Since surface of a metal has a high surface energy and, in addition, is roughened for bonding with relief, it has a high bonding ability with the material of matrix. Therefore, sometimes, it becomes difficult to release the matrix after pressing. On the other hand, according to the present invention, the matrix pressed to the original plate contacts with the relief supporting layer at the portions where no relief is present. Since the relief supporting layer is usually hardened resin, the supporting layer has small bonding ability with the matrix which is different material from the layer and the matrix can easily be released from the original plate. Use of a releasing agent can further accelerate the releasing.

The third advantage obtained by the presence of the relief supporting layer is that thermal conductivity of the plate becomes low. In the production of matrix by pressing with heat, the original plate is not so much heated, but the material for matrix is heated to soften and then they are pressed. Presence of the relief supporting layer causes reduction in loss of heat and so the production of matrix can be carried out at low heating temperature of the material for matrix. Furthermore, pressing time may be short and thus efficiency may be increased. Moreover, heat shock on the original plate can be made small and fracture of the plate due to heat seldom occurs. Thermal expansion and contraction are also little and reproducibility is increased.

The fourth advantage obtained by the presence of the relief supporting layer is that the relief supporting layer has an action of relaxing the pressure applied on the original plate. As mentioned above, the production of matrix is carried out by applying a pressure. When the relief is placed on a resin layer, namely, the relief supporting layer, the pressure applied is distributed not only to the relief but also to the relief supporting layer, and thus fracture of the plate due to pressing seldom occurs as compared with a plate wherein the relief is directly placed on the metal plate.

The original plate of the present invention which consists of a laminated structure is produced with use of a photo-polymerizable composition in various ways. There are, for example, the following methods, namely, a method which comprises laminate molding four layers of a metal base, a bonding layer, a relief supporting layer and a photo-polymerizable relief forming layer to obtain a solid plate, exposing said solid plate to light through a negative film placed thereon and then developing the plate, a method which comprises casting a liquid photo-polymerizable composition to a laminated plate comprising three layers of a metal base, a bonding layer and a relief supporting layer, exposing the said plate through a negative film and then developing the exposed plate, a method which comprises casting a liquid thermosetting composition or a liquid photo-polymerizable composition to a plate comprising a metal base and a bonding layer bonded to the base, hardening (or half-hardening) the resin with heat or light to form a relief supporting layer and furthermore forming thereon a relief of a photo-polymerized resin, a method which comprises forming a relief of a photo-polymerized resin on a relief supporting layer and bonding the layer to a metal base by a bonding layer sandwiched therebetween, etc.

As the metal base, plates of iron, stainless steel, aluminum, zinc, copper, magnesium, nickel, etc. or alloys thereof may be used. Thickness of the metal base may be determined depending upon the desired hardness, flexibility, strength and weight, but from economical view point, it is suitably about 0.2–5 mm. The surface is preferably roughened to increase adhesion.

As the bonding layer, any materials which are suitable for causing adhesion between the metal base and the relief supporting layer may be used. Examples thereof are coating materials, adhesives and the like including, for example, alkyd resin such as condensation product of polyhydric alcohol (e.g. ethylene glycol, propylene glycol, glycerin, pentaerythritol, etc.) with polybasic acid (e.g. phthalic anhydride, isophthalic acid, maleic anhydride, terpene-maleic anhydride addition product, rosinmaleic anhydride addition product) and oil modified product thereof; urethane resin such as condensation product of toluene diisocyanate with 1,3-butylene glycol and condensation product of toluene diisocyanate with trimethylol propane; epoxy resin such as product obtained by cross-linking with ethylene diamine or diethylene triamine the reaction product of bisphenol A with epichlorohydrin. Colored pigments may be incorporated into the bonding layer to prevent halation in hardening of the photomerizable composition. Thickness of the bonding layer may be determined from the point of adhesiveness and the thinner, the better. It is usually about 0.001–0.1 mm. Formation of the layer may be carried out by coating, pressure-bonding with heat, etc.

As the relief supporting layer, resins which are similar to those of relief or have an extremely high affinity with the relief may be used.

Such resins for the relief supporting layer are required to include 65 wt.% or more, preferably 85 wt.% or more, of the material used for formation of relief. Other component, that is, 35 wt.% or less, preferably 15 wt.% or less of the relief supporting layer is any of materials, which may be used for formation of relief, other than said material being used as the relief. A material not within said range is not preferable because of difficulty in keeping adhesiveness between the relief and the relief supporting layer. In hardening of the relief supporting layer, incomplete hardening, namely, so-called half-hardening can result in stronger adhesion with relief at later stage. For such purpose, hardening by means of light is preferable because hardening degree may be controlled by intensity of irradiation. Time of exposing to light for formation of relief (main exposure) is generally in a range from 2 to 30 minutes in practical view point. Said half-hardening in the present invention may be achieved by exposure to light in a time of 1 to 25 minutes, preferably 1.5 to 20 minutes. Simple method for formation of relief comprises firstly half-hardening a relief supporting layer of a photo-polymerizable composition, casting thereon relief forming layer of the photo-polymerizable composition and then exposing the relief forming layer through a negative film to produce relief.

Furthermore, also when a solid photo-polymerizable sheet is used for formation of relief, a hardened sheet of the same as or similar to the relief may be used as the relief supporting layer. Thus formed relief supporting layer may be bonded to a metal base through the bonding layer by laminate molding with roll or press. Since the relief supporting layer must not be dissolved out by development (washing out) after exposure, it is necessary to harden or insolubilize it with some additives.

As a result of examining the condition to give a property as mentioned above to the relief supporting layer, there was found the following requirement. Thickness of the relief supporting layer and ratio of thickness of the relief supporting layer to that of the relief layer should be in a definite range. It was found that the thickness of relief supporting layer should be in a range of 0.2 to 1.5 mm and further in a range 1/3–2/1 the thickness of the relief layer. When the thickness is less than 0.2 mm or less than one-third that of the relief layer, a higher temperature is required and production condition is extremely limited because of heat loss on hot-pressing for formation of matrix, and the bufferring action to pressure on pressing is less. On the other hand, when the thickness is more than 1.5 mm or more than 2/1 that of the relief layer, an effect of using the metal plate is lost and it is difficult to keep dimentional stability in formation of matrix.

Various photo-polymerizable resin compositions may be used as the main material for formation of relief supporting layer and relief. One component of this main material (I) is a compound having one or more of ethylenically unsaturated bonds such as styrene, p-chlorostyrene, α-methylstyrene, acrylamide, methacrylamide, acrylonitrile, methacrylonitrile, methylvinyl ether, methylvinyl ketone, vinyl acetate, acrylic acid, methyl acrylate, methyl methacrylate, 2-hydroxyethyl methacrylate, methacrylic acid, fumaric acid, maleic anhydride, itaconic acid, divinylbenzene, triethylene glycol dimethacrylate, trimethylolpropane triacrylate, etc. These may be used alone or as a mixture of two or more. Other component of the main material (II) is, for example, a polycondensate, so-called unsaturated polyester, of $\alpha,\beta$-unsaturated dicarboxylic acid (a part of which may be replaced with a saturated polyvalent carboxylic acid such as glutaric acid, adipic acid, phthalic acid, or trimellitic acid) and a polyhydric alcohol such as ethylene glycol, diethylene glycol, tripropylene glycol, butane diol or pentaerythritol, hydrogenated bisphenol A, bishydroxyethyl telephthalate, polyallylacrylate, etc. Examples of further other material (III) are polyamides obtained from hexamethylenediamino adipate, hexamethylene diamino sebacate, $\epsilon$-caprolactam, etc., polyurethanes obtained from polytetramethylene oxide, toluene-diisocyanate, etc., cellulose acetate, polyvinyl alcohol derivatives.

The components (I) and (II), or (I) and (III) are to be used in a range of (I)/(II) or (III) = 20 − 50/80 − 50 (wt.%/wt.%).

As auxiliary material, per 100 parts by weight of the main material for formation of relief supporting layer and relief, 0.5–5 parts by weight of a photo-polymerization initiator (e.g., benzoin, benzoin methylether, benzoin isopropylether, 9,10-anthraquinone, 1-chloroanthraquinone etc.) and 0.05–0.5 parts by weight of a polymerization-inhibitor (e.g. hydroquinone, hydroquinone monomethyl ether, 2,6-di-tert-butyl cresol etc.) may be incorporated. The relief forming layer is provided on the relief supporting layer by casting the liquid composition or laminate molding the solid composition in a form of a sheet by roll or press and thus obtained relief forming layer is exposed to light through a negative film which is in contact with said layer and is developed and dried to obtain a desired relief.

The relief supporting layer and the relief are required to have strength and stability high enough to stand conditions for production of matrix (temperature and pressure) and the material and compositions must be chosen depending thereupon. Furthermore, hardening with heat and/or light may be additionally carried out subsequent to hardening with light and it is fundamentally required to maintain a hardness higher than that of the material of matrix under conditions for production of the matrix.

The original plate of the present invention may be used as the original plate for production of matrix for printing plates, decorative plates, seals, stamps and the like.

The present invention will be illustrated in the following Examples.

EXAMPLE 1

The original plate having laminated structure of the present invention was produced in the following manner and the obtained plate was subjected to matrix producing test.

Preparation of Photo-polymerizable Liquid

An unsaturated polyester having an acid value of 30 was synthesized from maleic anhydride and isophthalic acid (3:1 in molar ratio) as an acid component and propylene glycol as an alcohl component. To 70 parts by weight of the resultant polyester were added 30 parts by weight of styrene, 0.1 part by weight of hydroquinone as a thermal polymerization inhibitor and 1 part by weight of benzoin as a photo-polymerization initiator and these were well mixed with agitation. The mixture was preserved in cold and dark place.

Formation of Bonding Layer

A tin plate of 0.5 mm in thickness was cut into B4 size (257 × 364 mm) and the surface was roughened with sandblasting. To this surface was applied a commercially available brown paint (made by Shinto Paint Co. Ltd., having the trade name "Kuromukoto F") mainly composed of a synthetic resin as the bonding layer and this was air-dried. Thickness of this layer was 0.02 mm.

Formation of Relief Supporting Layer

Said photo-polymerizable liquid was poured onto said bonding layer which was kept horizontal and a layer of 0.25 mm in thickness was formed with a doctor. This layer was exposed to light from a light source comprising ten ultraviolet lamps of 20 W and being placed at a distance of about 5 cm from said layer for 10 minutes to half-harden the layer.

Formation of Relief

A spacer of 0.55 mm in thickness was placed around said layer and said photo-polymerizable liquid was added thereto. Excess liquid was removed with a doctor. A negative film was put thereon and then a glass plate thereon in contact with each other. This was exposed to light from said light source positioned at a distance of 5 cm from the layer for 15 minutes to harden it and then unhardened portions were washed away with 0.1% solution of sodium hydroxide. Then, this was washed with water and dried and was exposed to the light for 10 minutes to complete hardening.

Matrix Producing Test

Matrix producing test was effected using thus obtained relief plate as an original plate. For comparison, control plate (A) having no relief supporting layer and control (B) having a polyester plate (0.5 mm in thickness) as a base and no bonding layer were produced in the same manner as mentioned above and were also used for production of matrix.

A polycarbonate plate (molecular weight 22,500; density 1.2) of 2 mm in thickness as material for matrix was pressed onto each plate produced above with a hot press of a pressure of 20 kg/cm$^2$ at 280° C for 3 minutes to produce three matrices.

The results are shown below.

| Original plate | Production of matrix | Reproducibility of size of matrix |
|---|---|---|
| This Example | No change was caused in the original plate even after production of eight matrices. | Good |
| Control plate (A) | Relief was peeled and matrix could not be produced. | — |
| Control plate (B) | Cracks occurred in the relief supporting layer after production of three matrices. | Not good |

EXAMPLE 2

An unsaturated polyester having an acid value of 32 was synthesized from maleic anhydride and phthalic anhydride (3:1 in molar ratio) as an acid component and triethylene glycol as an alcohol component. To 65 parts by weight of the resultant polyester were added 35 parts by weight of styrene, 0.1 part by weight of hydroquinone as a thermal polymerization inhibitor and 1 part by weight of benzoin methyl ether as a photopolymerization initiator and they were well mixed to obtain a homogeneous liquid. Using this liquid as a photo-polymerizable composition and an Al plate of 0.5 mm in thickness as a base an original plate, a control plates (C) and (D) were produced in the same manner as Example 1.

Paper materices were produced by using material for paper matrix for newspaper as the material for matrix and by adding 30% of water to said material and pressing it into said original plate at normal temperature under 150 kg/cm² for 20 seconds. The original plate showed no change even after production of five paper matrices. In case of the control plate (C), the relief was peeled and in case of the control plate (D), the relief supporting plate was peeled and no paper matrix could be produced.

EXAMPLE 3

Twenty parts of polyamide [soluble in alcohol; condensation product of hexamethylenediammonium adipate (35 wt.%) and p,p'-diammoniumdicyclohexylmethane adipate (35 wt.%) with ε-caprolactam (30 wt.%)], 4 parts by weight of glycidyl methacrylate, 1 part by weight of methacrylic acid, 0.8 part by weight of benzophenone and 0.1 part by weight of hydroquinone monomethyl ether were dissolved in 90 parts of methanol. The solution was cast on a stainless steel plate and methanol was evaporated. Thereafter, the casting was cut into chips. Then, the chips were laminated on the iron plate having the bonding layer of Example 1 at 120° C and under 100 kg/cm² and were pressed to form a layer of 0.3 mm in thickness, which was exposed to light from a mercury lamp (3 kw) for 5 minutes to form a relief supporting layer. Thereafter, similarly a layer of 0.5 mm in thickness was formed by press and was exposed to light for 10 minutes through a negative film which was put on the layer. Thus exposed layer was washed with methanol to obtain a relief plate, which was then post-exposed for further 10 minutes to complete hardening. Matrices of polyethylene (melt index 20, density 0.92) were produced using thus obtained relief plate as an original plate in the same manner as in Example 1 except the temperature of a hot press was 120° C instead of 280° C. No change was caused in the original plate even after production of six matrices. In case of no relief supporting layer present, relief of the original plate was peeled and matrix could not be produced. Furthermore, the original plate having a base of nylon resulted in cracks in the relief supporting layer at production of the second matrix.

EXAMPLE 4

98 Parts of polyvinyl alcohol (molecular weight 500 and saponification value 88%), 33 parts of sodium benzaldehyde-o-sulfonate and 4 parts of 2,6-di-t-butyl-p-cresol were mixed with 400 parts of acrylic acid and 200 parts of glacial acetic acid. To the mixture was gradually added 28 parts of acryloyl chloride to cause a reaction. Thus, a polyvinyl alcohol derivative having hydroxyl group, acetyl group, acryloyl group and o-sulfobenzal was produced. 60 Parts by weight of thus obtained resin, 40 parts by weight of 2-hydroxyethylmethacrylate, 0.8 part by weight of benzoin and 0.08 part by weight of hydroquinone were dissolved in 90 parts of water. Using the resultant solution, a relief supporting layer of 0.35 mm in thickness was formed on the same iron plate having the bonding layer thereon as in Example 1 and moreover relief of 0.65 mm in thickness was formed thereon to obtain a resin relief plate. In the same manner as in Example 1, matrices were produced using said relief plate as original plate. No damages were caused in the original plate even after production of ten matrices. Without the relief supporting layer, relief of the original plate was peeled at the production of the third matrix.

What is claimed is:

1. An original plate for production of matrix having a four layer structure consisting of
   a metal base having a thickness of 0.2–5 mm,
   a bonding layer having a thickness of 0.001–0.1 mm,
   a relief supporting layer having a thickness of 0.2–1.5 mm and
   a relief of a photopolymerized resin wherein the thickness of the relief supporting layer is 1.3–2/1 the thickness of the relief and the relief supporting layer contains at least 65% by weight of the material for formation of the relief.

2. The original plate of claim 1, wherein the metal base is selected from plates of iron, stainless steel, aluminum, zinc, copper, magnesium, nickel and alloys thereof.

3. The original plate of claim 1, wherein the bonding layer is paint or adhesive comprising alkyd resin, urethane resin or epoxy resin.

4. The original plate of claim 1, wherein the material for formation of the relief supporting layer and the relief is selected from a compound having one or more ethylenically unsaturated bonds as one component, and a polycondensate of α,β-unsaturated dicarboxylic acid (a part of which may be replaced with a saturated polyvalent carboxylic acid such as glutaric acid, adipic acid, phthalic acid or trimellitic acid) and polyhydric alcohols, polyallylacrylate, polyamides, polyurethane, cellulose acetate or polyvinyl alcohol derivatives as other component.

5. The original plate of claim 4, wherein the material for formation of the relief supporting layer and the relief additionally contains a photo-polymerization initiator and a polymerization inhibitor.

6. The original plate of claim 4, wherein the compound having one or more ethylenically unsaturated bonds is selected from the group consisting of styrene, p-chlorostyrene, α-methylstyrene, acrylamide, methacrylamide, acrylonitrile, methacrylonitrile, methylvinyl ether, methylvinyl ketone, vinyl acetate, acrylic acid, methyl acrylate, methyl methacrylate, 2-hydroxyethyl methacrylate, methacrylic acid, fumaric acid, maleic anhydride, itaconic acid, divinyl benzene, triethylene glycol dimethacrylate and trimethylpropane triacrylate and a mixture thereof.

* * * * *

UNITED STATES PATENT AND TRADEMARK OFFICE
CERTIFICATE OF CORRECTION

PATENT NO. : 4,079,159
DATED : March 14, 1978
INVENTOR(S) : Takezo SANO, ET AL.

It is certified that error appears in the above-identified patent and that said Letters Patent are hereby corrected as shown below:

Column 8, line 40, change "1.3" to -- 1/3 --.

Signed and Sealed this

Twenty-second Day of August 1978

[SEAL]

Attest:

RUTH C. MASON
Attesting Officer

DONALD W. BANNER
Commissioner of Patents and Trademarks